(12) United States Patent
Wang (10) Patent No.: US 10,490,522 B2
(45) Date of Patent: *Nov. 26, 2019

(54) SEMI-CONDUCTOR PACKAGE STRUCTURE (71) Applicant: Intel Corporation, Santa Clara, CA (US)

(72) Inventor: Xinhua Wang, Hangzhou (CN)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/034,917

(22) Filed: Jul. 13, 2018

(65) Prior Publication Data
US 2018/0323164 A1 Nov. 8, 2018

Related U.S. Application Data

(63) Continuation of application No. 15/599,160, filed on May 18, 2017, now Pat. No. 10,224,302, which is a continuation of application No. 15/195,324, filed on Jun. 28, 2016, now Pat. No. 9,659,895.

(30) Foreign Application Priority Data

Jul. 1, 2015 (CN) .......................... 2015 1 0378948

(51) Int. Cl.
*H01L 23/498* (2006.01)
*H01L 23/00* (2006.01)

(52) U.S. Cl.
CPC ........ *H01L 24/17* (2013.01); *H01L 23/49838* (2013.01); *H01L 24/02* (2013.01); *H01L 23/49816* (2013.01); *H01L 2224/02331* (2013.01); *H01L 2224/16225* (2013.01); *H01L 2224/17132* (2013.01)

(58) Field of Classification Search
None
See application file for complete search history.

(56) References Cited

U.S. PATENT DOCUMENTS

| | | |
|---|---|---|
| 3,981,546 A | 9/1976 | Sperman |
| 7,161,251 B2 | 1/2007 | Vonstaudt |
| 7,667,321 B2 | 2/2010 | Rebelo et al. |

(Continued)

FOREIGN PATENT DOCUMENTS

CN 104966708 B 6/2018

OTHER PUBLICATIONS

"U.S. Appl. No. 15/195,324, Notice of Allowance dated Jan. 19, 2017", 8 pgs.

(Continued)

*Primary Examiner* — Chandra Chaudhari
(74) *Attorney, Agent, or Firm* — Schwegman Lundberg & Woessner, P.A.

(57) ABSTRACT

Disclosed is a semiconductor package structure comprising a body, a plurality of first-layer, second-layer, third-layer and fourth-layer electrical contacts, wherein the first-layer, the second-layer, the third-layer and the fourth-layer electrical contacts are arranged sequentially from outside, to inside on a bottom surface of the body in a matrix manner. Adjacent first-layer electrical contacts have two different spacings therein, and adjacent third-layer electrical contacts have the two different spacings therein.

18 Claims, 7 Drawing Sheets

(56) References Cited

U.S. PATENT DOCUMENTS

| | | |
|---|---|---|
| 7,932,604 B2 | 4/2011 | Mahajan et al. |
| 8,093,708 B2 | 1/2012 | Lövskog |
| 8,354,746 B2 | 1/2013 | Huang et al. |
| 9,659,895 B2 | 5/2017 | Wang |
| 9,831,167 B1 * | 11/2017 | Lin .................. H01L 23/49838 |
| 10,224,302 B2 | 3/2019 | Wang |
| 2005/0156299 A1 | 7/2005 | Vonstaudt |
| 2017/0005061 A1 | 1/2017 | Wang |
| 2018/0096959 A1 | 4/2018 | Wang |
| 2019/0123010 A1 | 4/2019 | Wang |

OTHER PUBLICATIONS

"U.S. Appl. No. 15/599,160, Non Final Office Action dated Apr. 13, 2018", 6 pgs.

"U.S. Appl. No. 15/599,160, Response filed Jul. 13, 2018 to Non Final Office Action dated Apr. 13, 2018", 5 pgs.

"Chinese Application Serial No. 201510378948.5, Office Action dated Jun. 2, 2017", With English Translation, 11 pgs.

"Chinese Application Serial No. 201510378948.5, Response filed Oct. 16, 2017 to Office Action dated Jun. 2, 2017", w/ claims in English, 9 pgs.

"U.S. Appl. No. 15/599,160, Notice of Allowance dated Oct. 24, 2018", 7 pgs.

"Indian Application Serial No. 201644021373, Voluntary Amendment filed Oct. 18, 2018", W English Claims, 9 pgs.

"U.S. Appl. No. 15/599,160, Corrected Notice of Allowability dated Nov. 23, 2018", 2 pgs.

"U.S. Appl. No. 16/220,706, Non Final Office Action dated Jun. 28, 2019", 8 pgs.

* cited by examiner

FIG. 4A

SEMI-CONDUCTOR PACKAGE STRUCTURE

TECHNICAL FIELD

The present invention relates to a semiconductor package structure, and in particular to a grid array package structure.

BACKGROUND

Figure 1:
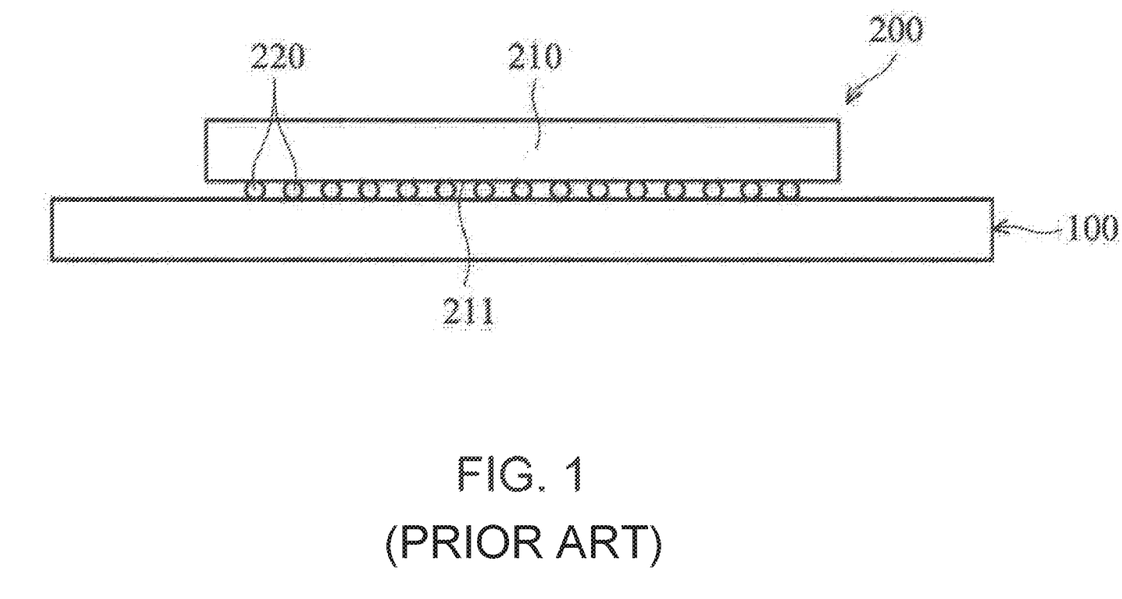
FIG. 1 is a schematic view of a combination of an existing semiconductor package structure and a circuit board.
Figure 2:
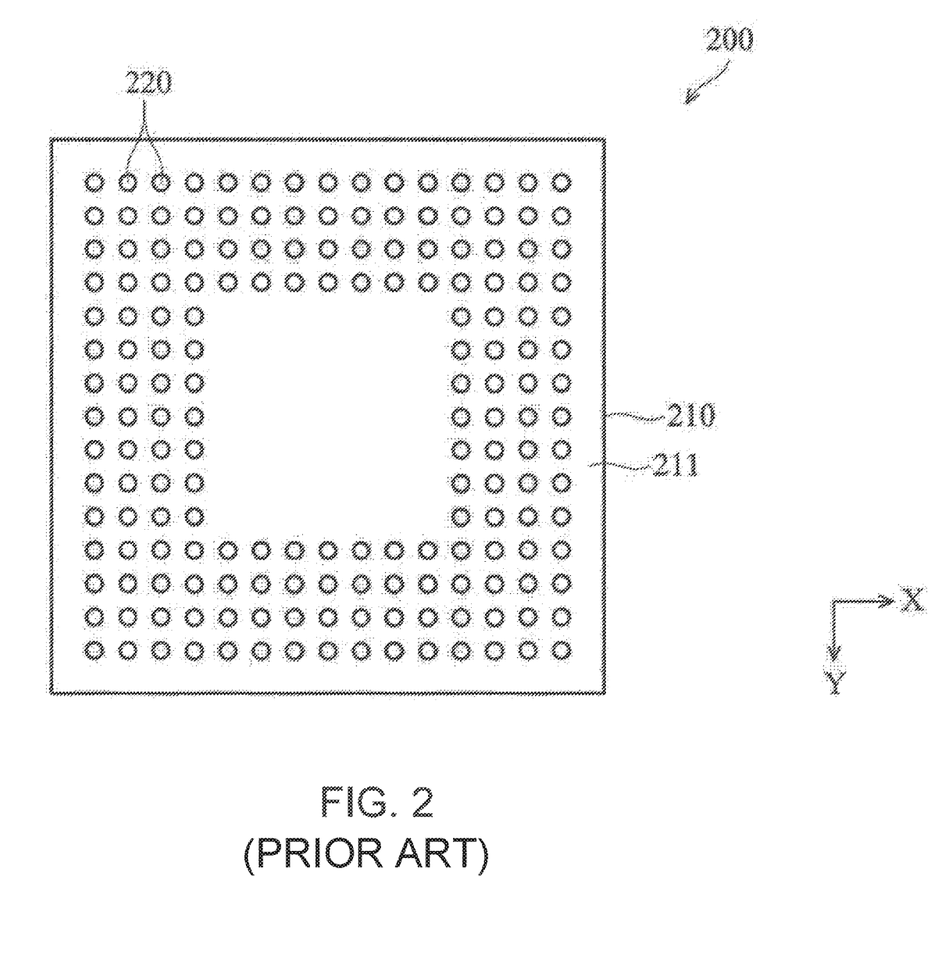
FIG. 2 is a bottom view of the existing semiconductor package structure of FIG. 1.

In the field of semiconductor package technology, common types of semiconductor chip package comprise the ball grid array (BGA) package, the chip scale package (CSP), the flip chip (FC) package and the like. For example, a ball grid array package structure 200 as shown in FIGS. 1 and 2 mainly comprises a body 210 and solder balls 220 arranged in array on a bottom surface 211 of the body 210, wherein the solder halls 220 can substitute for a conventional metal lead frame to serve as electrical contacts, such that the ball grid array package structure may have the merit of large area and large quantity of transmitted signals. It needs to be specifically noted that the body 210 has semiconductor chip disposed therein, wherein the semiconductor chip may be electrically connected to a underlying printed circuit board 100 through the solder balls 220 located on the bottom surface 211 of the body 210.

However, with the increasing complexity of semiconductor circuits and the increasing number of signal pins, there is generally difficulty during circuit layout for package substrate.

SUMMARY OF THE INVENTION

In order to solve the above-mentioned problems, an embodiment of the present invention provides a semiconductor package structure comprising a body, a plurality of first-layer electrical contacts, a plurality of second-layer electrical contacts, a plurality of third-layer electrical contacts and a plurality of fourth-layer electrical contacts. The body encloses a semiconductor chip and has a bottom surface, and the first-layer, the second-layer, the third-layer and the fourth-layer electrical contacts are electrically connected to the semiconductor chip and are arranged sequentially from outside to inside on the bottom surface in a matrix manner. Wherein, adjacent first-layer electrical contacts have two different spacings therebetween, and adjacent third-layer electrical contacts also have the two different spacings therebetween, wherein said two different spacings comprise a first spacing and a second spacing greater than the first spacing.

In an embodiment of the present invention, the second spacing is twice the first spacing.

In an embodiment of the present invention, the first spacing is a minimum spacing between adjacent first-layer electrical contacts.

In an embodiment of the present invention, the first spacing is a minimum spacing between adjacent third-layer electrical contacts.

In an embodiment of the present invention, the first-layer electrical contacts comprise a first pair of electrical contacts with the first spacing, a second pair of electrical contacts with the first spacing and a third pair of electrical contacts with the first spacing, the first pair of electrical contacts and the second pair of electrical contacts having the second spacing therebetween, the second pair of electrical contacts and the third pair of electrical contacts having the second spacing therebetween, and the second pair of electrical contacts being located between the first pair of electrical contacts and the third pair of electrical contacts.

In an embodiment of the present invention, the third-layer electrical contacts comprise a fourth pair of electrical contacts with the first spacing, a fifth pair of electrical contacts with the first spacing and a sixth pair of electrical contacts with the first spacing, the fourth pair of electrical contacts and. the fifth pair of electrical contacts having the second spacing therebetween, the fifth pair of electrical contacts and the sixth pair of electrical contacts having the second spacing therebetween, and the fifth pair of electrical contacts being located between the fourth pair of electrical contacts and the sixth pair of electrical contacts.

In an embodiment of the present invention, the body further has a package substrate with a first circuit layer and a second circuit layer.

In an embodiment of the present invention., the first circuit layer comprises a plurality of conductors and a plurality of conductive portions, the conductive portions being connected to the conductors and at least a portion of the first-layer electrical contacts and second-layer electrical contacts respectively.

In an embodiment of the present invention, the second circuit layer comprises a plurality of conductors and a plurality of conductive portions, the conductive portions being connected to the conductors and at least a portion of the third-layer electrical contacts and fourth-layer electrical contacts respectively.

In a semiconductor package structure embodiment of the present invention, the semiconductor package structure is a ball grid array package structure.

To make h above-mentioned objects, features and advantages of the present invention more comprehensible, a detailed description is given below with preferred embodiments in conjunction with the accompanied drawings.

DETAILED DESCRIPTION OF THE INVENTION

Preferred embodiments of the present invention are now described in conjunction with the drawings.

The aforementioned and other technical contents, features and performances related to the present invention will be clearly presented in the following detailed description of a preferred embodiment in conjunction with the drawings. The direction terms as mentioned in the following embodiment, e.g., upper, lower, left, right, front, rear, etc., are only directions with reference to the accompanying drawings.

Thus, the direction terms used are intended to illustrate but not to limit the present invention.

Figure 3A:
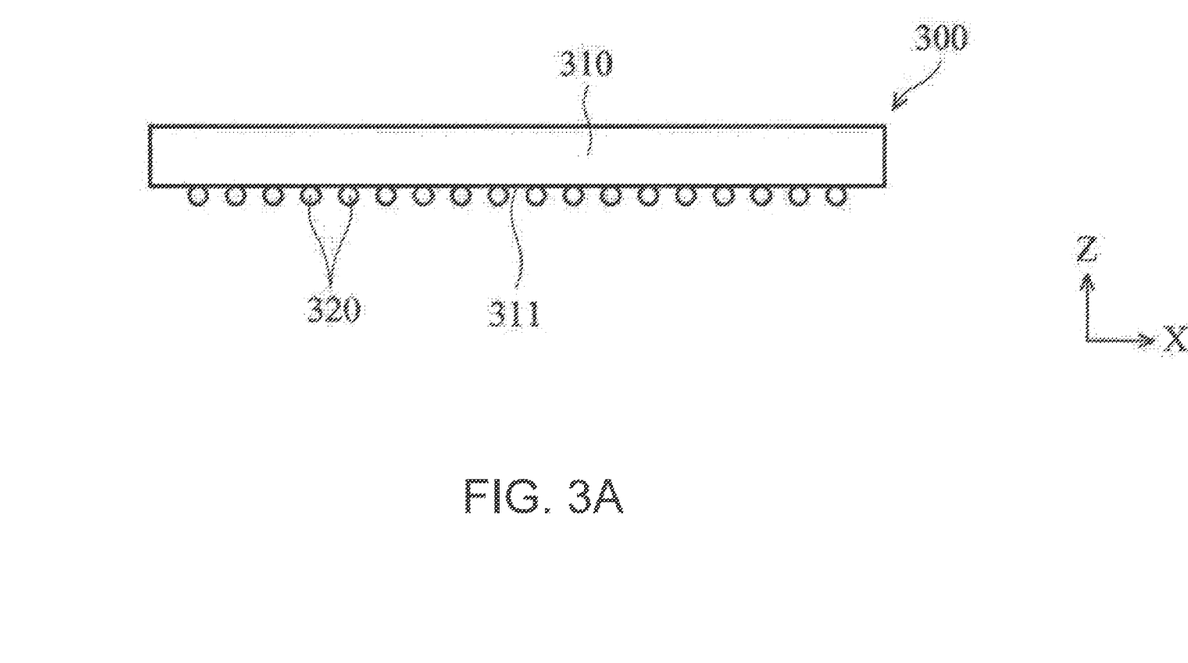
FIG. 3A is a schematic view of a semiconductor package structure of an embodiment of the present invention.

Referring to FIG. 3A first, a semiconductor package structure 300 of an embodiment of the present invention is a ball grid array package structure mainly comprising a body 310 and a plurality of electrical contacts 320 disposed on the bottom surface 311 of the body 310. The body 310 encloses a semiconductor chip (not shown), wherein the semiconductor chip is electrically connected to the electrical contacts 320, such that electronic signals are to be transmitted to an external circuit hoard (not shown) through the electrical contacts 320. The electrical contacts 320 are, for example, solder balls, wherein the solder balls and corresponding metal contacts on a circuit board may be electrically connected to one another through welding in order to transfer electronic signals.

Figure 3B:
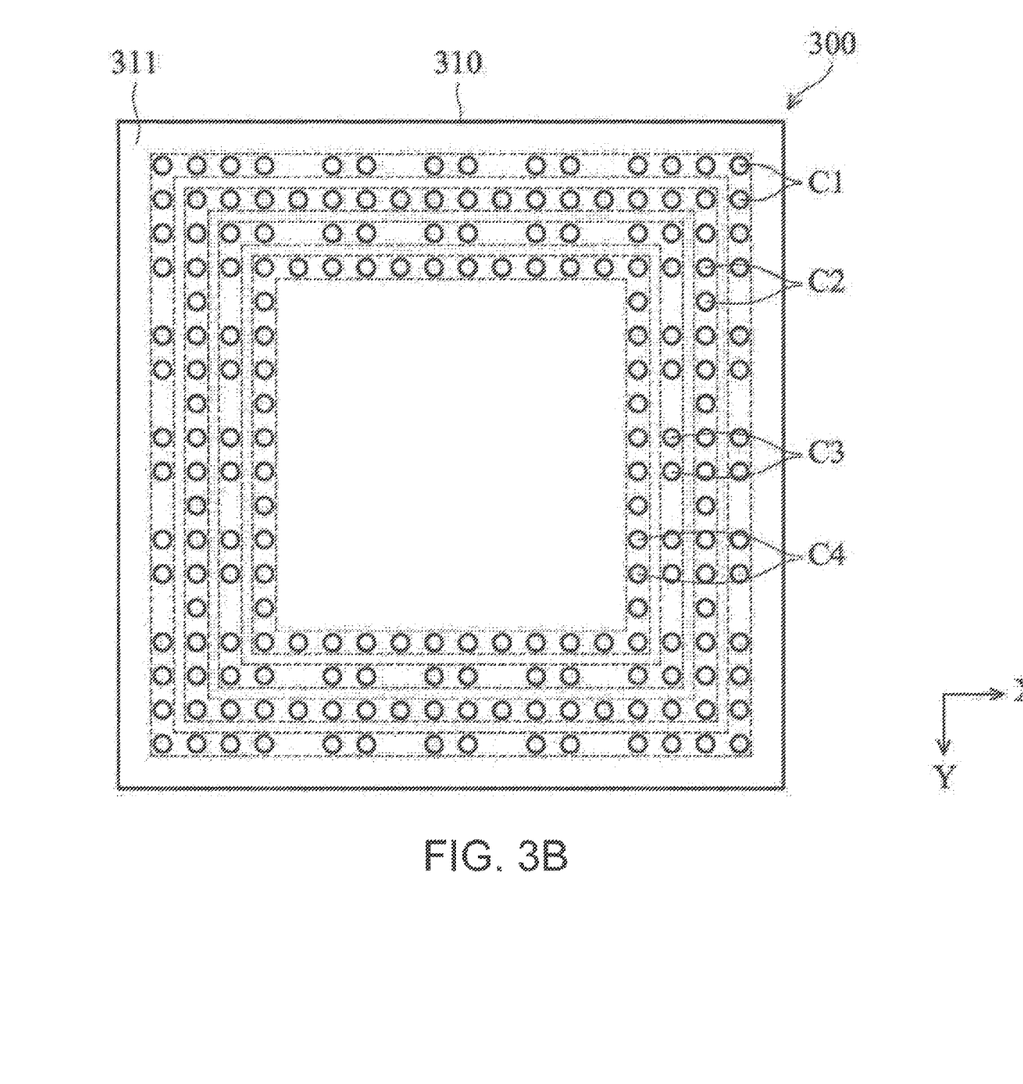
FIG. 3B is a bottom view of the semiconductor package structure of FIG. 3A.

As shown in FIG. 3B, the electrical contacts 320 disposed on the bottom surface 311 of the body 310 are arranged in a matrix manner and may be differentiated as, from outside to inside, first-layer electrical contacts C1, second-layer electrical contacts C2, third-layer electrical contacts C3 and fourth-layer electrical contacts C4, according to different positions thereof. That is, the first-layer, second-layer, third-layer and fourth-layer electrical contacts C1-C4 are arranged sequentially from outside to inside on the bottom surface 311 in a matrix manner.

Figure 3C:
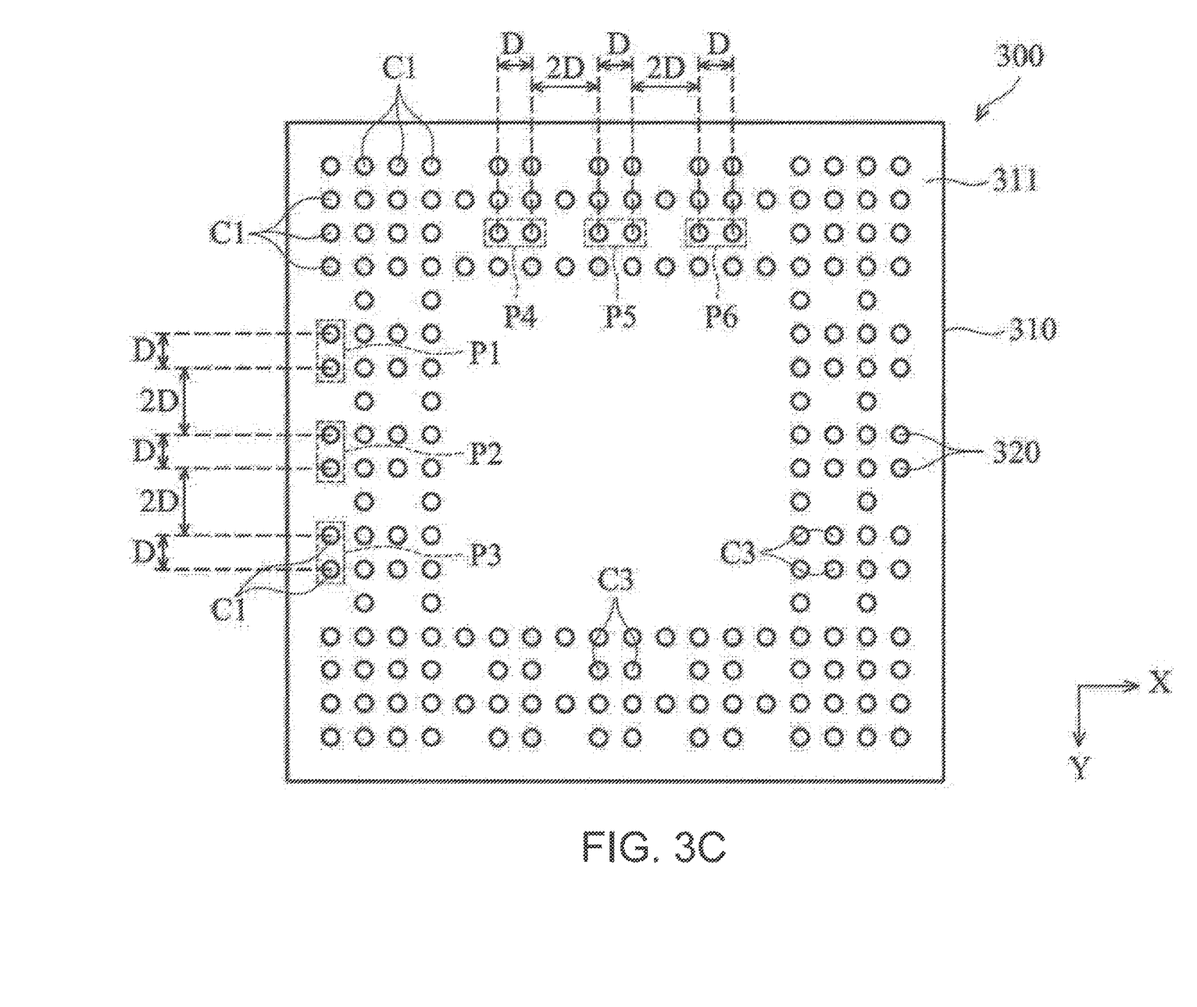
FIG. 3C is a schematic view of adjacent first-layer electrical contacts C1 having two different spacings D and 2D therebetween and adjacent third-layer electrical contacts C3 having the two different spacings D and 2D therebetween.

Referring next to FIG. 3C, adjacent first-layer electrical contacts C1 may have a first spacing D or a second spacing 2D therebetween, wherein the second spacing 2D is greater than the first spacing D. Likewise, adjacent third-layer electrical contacts C3 may also have the first spacing D and the second spacing 2D therebetween. In this embodiment, the first spacing D is the minimum spacing between the adjacent first-layer electrical contacts C1 or between the adjacent third-laver electrical contacts C3, and the second spacing 2D is twice the first spacing D.

It can be seen from FIG. 3C that the outermost first-layer electrical contacts C1 comprise a first pair of electrical contacts P1, a second pair of electrical contacts P2 and a third pair of electrical contacts P3, and these first, second and third pairs of electrical contacts P1, P2, P3 respectively contain two electrical contacts, said two electrical contacts forming a first spacing therebetween. In particular, the first pair of electrical contacts P1 and the second pair of electrical contacts P2 have the second spacing 2D formed therebetween, and the second pair of electrical contacts P2 and the third pair of electrical contacts P3 have the second spacing 213 formed therebetween as well, with the second pair of electrical contacts P2 being located between the first pair of electrical contacts P1 and the third pair of electrical contacts P3. That is, among the outermost first-layer electrical contacts C1, the first spacing D and the second spacing 2D are arranged alternately.

Still referring to FIG. 3C, the third-layer electrical contacts C3 comprise a fourth pair of electrical contacts P4, a fifth pair of electrical contacts P5 and a sixth pair of electrical contacts P6 therein, and the fourth pair of electrical contacts P4, the fifth pair of electrical contacts P5 and the sixth pair of electrical contacts P6 respectively comprise two electrical contacts, with the first spacing D being formed between the two electrical contacts. In particular, the fourth pair of electrical contacts P4 and the fifth pair of electrical contacts P5 have the second spacing 2D formed therebetween, and the fifth pair of electrical contacts P5 and the sixth pair of electrical contacts P6 have the second spacing 2D formed therebetween as well, with the fifth pair of electrical contacts P5 being located between the fourth pair of electrical contacts P4 and the sixth pair of electrical contacts P6. That is, among the third-layer electrical contacts C3, the first spacing D and the second spacing 2D are arranged alternately as well.

With the aforementioned special configuration of electrical contacts, the present invention makes the package substrate in the body 310 easier to use during circuit layout. For example, when the package substrate in the body 310 is a multi-layer circuit board, conductors connecting the "outer" electrical contacts can be arranged on a first circuit layer in the multi-layer circuit board, while conductors connecting the "inter" electrical contacts can be arranged on a second circuit layer in the multi-layer circuit board so as to avoid difficulties during circuit layout caused by over-crowded conductors.

Figure 4A:
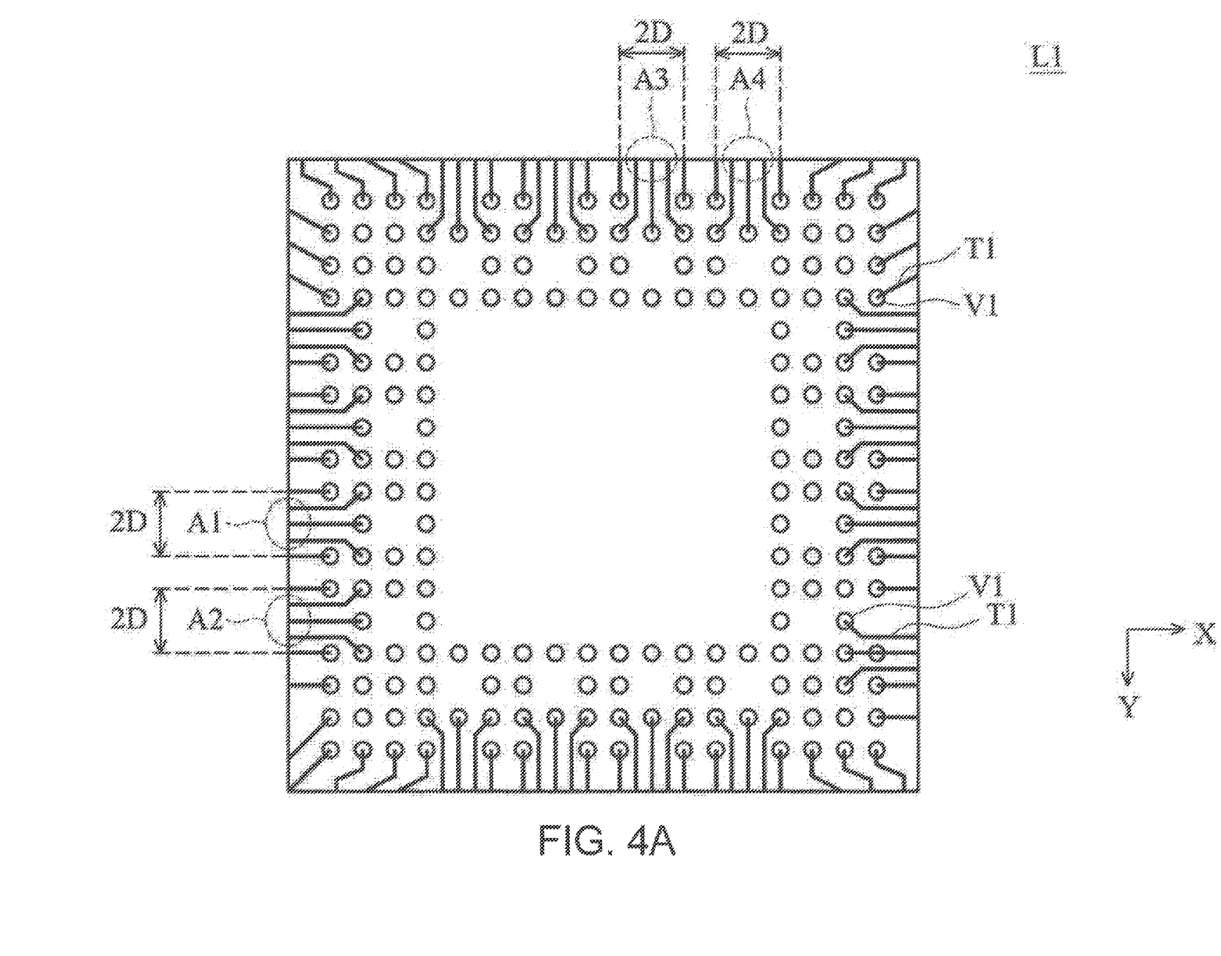
FIG. 4A is a schematic view of a first circuit layer in a package substrate of a body.

Referring again to FIGS. 4A and 4B, the body 310 of this embodiment comprises therein a package substrate which can be a multi-layer circuit board and comprises at least a first circuit layer L1 and a second circuit layer L2; it can be seen in FIG. 4A that a plurality of conductors T1 and a plurality of conductive portions V1 are disposed in the first circuit layer L1 of the package substrate, and the conductive portions V1 may be vias in a direction perpendicular to the bottom surface 311, wherein the interior of said vias is filled with a conductive material and the positions of said vias correspond to the electrical contacts 320 respectively. The conductive portions V1 are riot only connected to the corresponding conductors T1 respectively, meanwhile each conductive portion V1 is also connected to a portion of the first-layer electrical contacts C1 and the second-layer electrical contacts C2 corresponding to the position of the conductive portion V1. It needs to be specifically noted that as some adjacent first-layer electrical contacts C1 have greater second spacing 2D formed therebetween, conductors T1 extending from the inner conductive portions V1 can easily pass through the gaps (the second spacing 2D) between the outer conductive portions Vi to reach the edge of the package substrate (as shown in areas A1 to A4 in FIG. 4A, three conductors T1 can be allowed to pass) and therefore the difficulty in circuit layout can be significantly decreased.

Figure 4B:
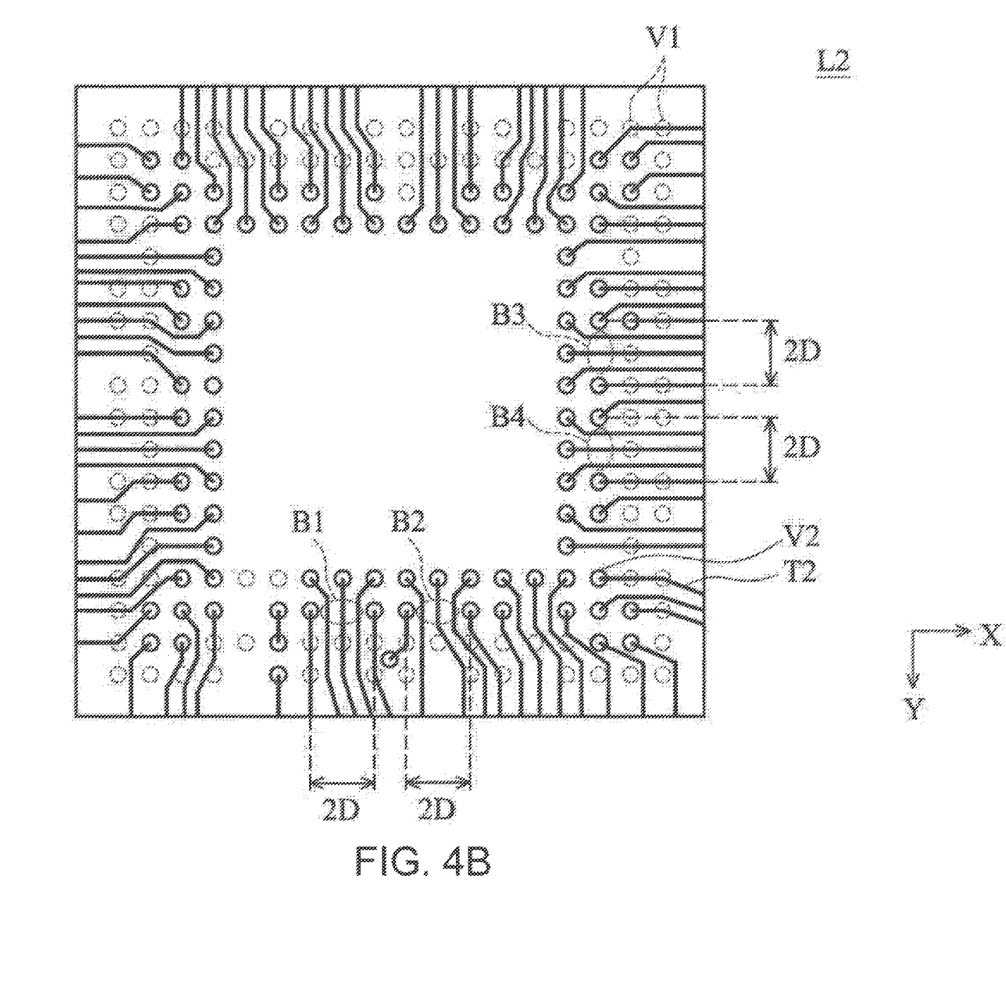
FIG. 4B is a schematic view of a second circuit layer in the package substrate of a body.

For the same reason, it can be seen in FIG. 4B that a plurality of conductors T2 and a plurality of conductive portions V2 are disposed in the second circuit layer L2 in the package substrate, and the conductive portions V2 may be vias in the direction perpendicular to the bottom surface 311, wherein the interior of said vias is filled with a conductive material to transmit electronic signals, wherein the conductive portions V2 are not only connected to corresponding conductors T2 respectively, meanwhile each conductive portion V2 is also connected to a portion of the third-layer electrical contacts C3 and the fourth-layer electrical contacts C4 corresponding to the position of the conductive portion V2. It needs to be specifically noted that as some adjacent third-layer electrical contacts C3 have greater second spacing 2D formed therebetween, conductors T2 extending from the inner conductive portions V2 can easily pass through the gaps (the second spacing 2D) between the outer conductive portions V2 to reach the edge of the package substrate (as shown in areas B1 to B4 in FIG. 4B, three conductors T2 can be allowed to pass), therefore the difficulty in circuit layout can be significantly decreased, wherein circles denoted by dotted lines in FIG. 4B represent the conductive portions V1 disposed in the first circuit layer L1 but not extending to the second circuit layer L2.

To sum up, the present invention provides a semiconductor package structure, wherein the semiconductor has first-layer, second-layer, third-layer and fourth-layer electrical contacts that are disposed sequentially from outside to inside on the bottom surface of the body of the semiconductor package structure. By making adjacent first-layer electrical contacts and adjacent third-layer electrical contacts have two different spacings (a smaller spacing D and a greater spacing 2D) therebetween, the present invention makes circuit layout within package substrates easier, so as to increase the overall performance and product yield of the semiconductor package structure.

Although the present invention is disclosed in conjunction with the above preferred embodiments, it is not intended to limit the present invention. Any person skilled in the art can make some modification and variation without departing from the spirit and scope of the present invention, and accordingly, the scope of protection of the present invention should be determined by those defined the appended claims.

What is claimed is:

1. A semiconductor device, comprising:
   a semiconductor chip mounted to a package body;
   a number of contacts located on the package body, the number of contacts electrically connected to the semiconductor chip, the number of contacts arranged in an array, the array including:
   a first layer, wherein the first layer includes contacts with a first spacing, and one or more gaps between contacts having a first layer gap spacing greater than the first spacing;
   a second layer inside the first layer, wherein the second layer includes contacts with only the first spacing; and
   a third layer inside the second layer, wherein the third layer includes contacts with the first spacing, and one or more gaps between contacts having a third layer gap spacing greater than the first spacing.

2. The semiconductor device of claim 1, wherein the first layer gap spacing is twice the first spacing.

3. The semiconductor device of claim 1, wherein the first layer gap spacing is greater than twice the first spacing.

4. The semiconductor device of claim 1, further including one or more lateral conductors passing through at least one of the gaps in the first layer.

5. The semiconductor device of claim 1, further including three lateral conductors passing through at least one of the gaps in the first layer.

6. The semiconductor device of claim 4, further including one or more lateral conductors passing through at least one of the gaps in the third layer.

7. The semiconductor device of claim 5, further including three lateral conductors passing through at least one of the gaps in the third layer.

8. The semiconductor device of claim 1, wherein the package body is a chip scale package.

9. The semiconductor device of claim 1, wherein the package body is a flip chip package.

10. The semiconductor device of claim 1, wherein the package body is a ball grid array package.

11. The semiconductor device of claim 1, wherein the number of contacts include solder.

12. A semiconductor device, comprising:
    a semiconductor chip mounted to a package body;
    a number of contacts located on the package body, the number of contacts electrically connected to the semiconductor chip, the number of contacts arranged in an array, the array including:
    a first layer, wherein the first layer includes contacts with a first spacing, and one or more gaps between contacts having a first layer gap spacing greater than the first spacing;
    a second layer inside the first layer, wherein the second layer includes contacts with only the first spacing;
    a third layer inside the second layer, wherein the third layer includes contacts with the first spacing, and one or more gaps between contacts having a third layer gap spacing greater than the first spacing; and
    a fourth layer including contacts having only the first spacing.

13. The semiconductor device of claim 12, wherein the first layer gap spacing is twice the first acing.

14. The semiconductor device of claim 12, wherein the first layer gap spacing is greater than twice the first spacing.

15. The semiconductor device of claim 12, wherein the package body is a chip scale package.

16. The semiconductor device of claim 12, wherein the package body is a flip chip package.

17. The semiconductor device of claim 12, wherein the package body is a ball grid array package.

18. The semiconductor device of claim 12, wherein the number of contacts include solder.

* * * * *